(12) United States Patent
Essawy et al.

(10) Patent No.: US 11,293,995 B2
(45) Date of Patent: Apr. 5, 2022

(54) DIFFERENTIAL LEAKAGE CURRENT MEASUREMENT FOR HEATER HEALTH MONITORING

(71) Applicant: Rosemount Aerospace Inc., Burnsville, MN (US)

(72) Inventors: Magdi A. Essawy, Lakeville, MN (US); Cuong Tho Huynh, Eagan, MN (US); Marvin G. Onken, Excelsior, MN (US)

(73) Assignee: ROSEMOUNT AEROSPACE INC., Burnsville, MN (US)

( * ) Notice: Subject to any disclaimer, the term of this patent is extended or adjusted under 35 U.S.C. 154(b) by 242 days.

(21) Appl. No.: 16/826,916

(22) Filed: Mar. 23, 2020

(65) Prior Publication Data

US 2021/0293895 A1 Sep. 23, 2021

(51) Int. Cl.
*G01R 31/52* (2020.01)
*G01C 23/00* (2006.01)
(Continued)

(52) U.S. Cl.
CPC .............. *G01R 31/52* (2020.01); *G01C 23/00* (2013.01); *G01R 31/008* (2013.01); *H05B 1/0236* (2013.01)

(58) Field of Classification Search
CPC .... G01R 31/52; G01R 31/008; G01R 15/202; G01R 15/207; G01R 31/2829;
(Continued)

(56) References Cited

U.S. PATENT DOCUMENTS

| 3,798,652 A | 3/1974 | Williams |
| 4,207,566 A | 6/1980 | Gitlin et al. |

(Continued)

FOREIGN PATENT DOCUMENTS

| CA | 1311028 | 5/1989 |
| CN | 105092050 A | 11/2015 |

(Continued)

OTHER PUBLICATIONS

Extended European Search Report for European Patent Application No. 19213783.4, dated Jun. 23, 2020, 7 pages.
(Continued)

*Primary Examiner* — Farhana A Hoque
(74) *Attorney, Agent, or Firm* — Kinney & Lange, P.A.

(57) ABSTRACT

A system and method for monitoring leakage current in a heater connected to a heater power supply by a power cable having a first power lead conducting an inlet current defining an inlet current direction and a second power lead conducting an outlet current defining an outlet current direction that is opposite the inlet current direction. The system includes a differential current electromagnetic sensor having a magnetic core with a center region that the power cable passes through one or more times. The magnetic core has an air gap in which a magnetic flux sensing device is positioned and configured to provide a signal that is representative of magnetic flux across the air gap, which is indicative of a difference between the inlet current and the outlet current. This difference defines the leakage current.

20 Claims, 9 Drawing Sheets

(51) Int. Cl.
    *G01R 31/00* (2006.01)
    *H05B 1/02* (2006.01)
(58) Field of Classification Search
    CPC ............... G01C 23/00; H05B 1/0236; B64D
                                        2045/0085; B64D 15/12
    USPC ........................................................ 324/503
    See application file for complete search history.

(56) References Cited

U.S. PATENT DOCUMENTS

| | | | |
|---|---|---|---|
| 4,267,721 | A | 5/1981 | Longenecker et al. |
| 4,506,259 | A | 3/1985 | Rhodes |
| 4,698,583 | A | 10/1987 | Sandberg |
| 5,216,226 | A | 6/1993 | Miyoshi |
| 5,218,294 | A | 6/1993 | Soiferman |
| 5,464,965 | A | 7/1995 | McGregor et al. |
| 5,767,781 | A | 6/1998 | Yavelberg |
| 6,070,475 | A | 6/2000 | Muehlhauser et al. |
| 6,151,560 | A | 11/2000 | Jones |
| 6,188,423 | B1 | 2/2001 | Pou |
| 6,218,647 | B1 | 4/2001 | Jones |
| 6,300,767 | B1 | 10/2001 | Kliman et al. |
| 6,336,083 | B1 | 1/2002 | Lanham et al. |
| 6,400,334 | B1 | 6/2002 | Lindenmeier et al. |
| 6,414,282 | B1 | 7/2002 | Ice et al. |
| 6,430,996 | B1 | 8/2002 | Anderson et al. |
| 6,906,537 | B2 | 6/2005 | Goldberg et al. |
| 7,012,538 | B2 | 3/2006 | Peck et al. |
| 7,202,451 | B2 | 4/2007 | Uchida et al. |
| 7,209,651 | B1 | 4/2007 | Knoeppel et al. |
| 7,219,023 | B2 | 5/2007 | Banke et al. |
| 7,490,510 | B2 | 2/2009 | Agami et al. |
| 7,647,843 | B2 | 1/2010 | Burton |
| 8,182,143 | B2 | 5/2012 | Fleming et al. |
| 8,269,513 | B2 | 9/2012 | Palm et al. |
| 8,466,390 | B2 | 6/2013 | Gaertner, II et al. |
| 8,711,008 | B2 | 4/2014 | Cook et al. |
| 8,890,703 | B2 | 11/2014 | Farris et al. |
| 9,046,899 | B2 | 6/2015 | Shearer et al. |
| 9,080,917 | B2 | 7/2015 | Nguyen et al. |
| 9,463,879 | B2 | 10/2016 | Khozikov et al. |
| 9,885,761 | B2 | 2/2018 | Schram |
| 9,919,812 | B2 | 3/2018 | Shi |
| 9,927,480 | B2 | 3/2018 | Nesnidal |
| 9,939,459 | B2 | 4/2018 | Dichek |
| 10,151,785 | B2 | 12/2018 | Essawy et al. |
| 10,180,449 | B2 | 1/2019 | Essawy et al. |
| 10,197,517 | B2 | 2/2019 | Essawy et al. |
| 10,564,203 | B2 | 2/2020 | Essawy et al. |
| 2002/0078752 | A1 | 6/2002 | Braunling et al. |
| 2003/0206111 | A1 | 11/2003 | Gao et al. |
| 2004/0075567 | A1 | 4/2004 | Peck et al. |
| 2004/0124358 | A1 | 7/2004 | Okamura et al. |
| 2004/0217106 | A1 | 11/2004 | Giterman |
| 2005/0232332 | A1 | 10/2005 | Hanson et al. |
| 2006/0096971 | A1 | 5/2006 | Reusche et al. |
| 2006/0250143 | A1 | 11/2006 | Moon et al. |
| 2007/0084857 | A1 | 4/2007 | Osaka |
| 2007/0125764 | A1 | 6/2007 | Knoeppel et al. |
| 2007/0208520 | A1 | 9/2007 | Zhang et al. |
| 2008/0018340 | A1 | 1/2008 | Arnou et al. |
| 2008/0183404 | A1 | 7/2008 | Emami et al. |
| 2008/0250796 | A1 | 10/2008 | Clugston et al. |
| 2009/0065502 | A1 | 3/2009 | Suenaga et al. |
| 2009/0321415 | A1 | 12/2009 | Zhang et al. |
| 2010/0108662 | A1 | 5/2010 | Taylor et al. |
| 2011/0058397 | A1 | 3/2011 | Rizzo |
| 2011/0106475 | A1 | 5/2011 | Wigen |
| 2011/0118990 | A1 | 5/2011 | Sidhu et al. |
| 2011/0290784 | A1 | 12/2011 | Orawetz et al. |
| 2011/0320139 | A1 | 12/2011 | Amir et al. |
| 2012/0133384 | A1 | 5/2012 | Palais et al. |
| 2012/0213246 | A1 | 8/2012 | Honbo et al. |
| 2012/0268074 | A1 | 10/2012 | Cooley et al. |
| 2012/0319706 | A1 | 12/2012 | Nadel et al. |
| 2013/0039565 | A1 | 2/2013 | Takeshima et al. |
| 2014/0033175 | A1 | 1/2014 | Lee et al. |
| 2014/0103938 | A1 | 4/2014 | Jones |
| 2014/0245830 | A1 | 9/2014 | Martin et al. |
| 2014/0331751 | A1 | 11/2014 | Macdonald |
| 2015/0014303 | A1 | 1/2015 | Kohler et al. |
| 2015/0042980 | A1 | 2/2015 | Liu et al. |
| 2015/0055940 | A1 | 2/2015 | Steinhauser |
| 2015/0104888 | A1 | 4/2015 | Lee |
| 2015/0142343 | A1 | 5/2015 | Zach et al. |
| 2015/0160148 | A1 | 6/2015 | Stanley |
| 2016/0013169 | A1 | 1/2016 | Standing |
| 2016/0054233 | A1 | 2/2016 | Bense et al. |
| 2016/0084986 | A1 | 3/2016 | Zach et al. |
| 2016/0131690 | A1 | 5/2016 | Ueno et al. |
| 2016/0131691 | A1 | 5/2016 | Nesnidal |
| 2016/0178680 | A1 | 6/2016 | Ntziachristos |
| 2016/0255184 | A1 | 9/2016 | Hwang |
| 2016/0291051 | A1 | 10/2016 | Golly et al. |
| 2016/0313259 | A1 | 10/2016 | Shayovitz |
| 2016/0338569 | A1 | 11/2016 | Reder et al. |
| 2016/0364629 | A1 | 12/2016 | Solli |
| 2016/0377487 | A1 | 12/2016 | Cheung et al. |
| 2017/0047821 | A1* | 2/2017 | Klassen ..................... B25J 9/12 |
| 2017/0110887 | A1 | 4/2017 | Bell et al. |
| 2017/0191875 | A1 | 7/2017 | Schmidt et al. |
| 2017/0259927 | A1 | 9/2017 | Schram |
| 2017/0299626 | A1 | 10/2017 | Dichek |
| 2017/0336156 | A1 | 11/2017 | Phillips |
| 2017/0343418 | A1 | 11/2017 | Hurbi et al. |
| 2017/0370748 | A1 | 12/2017 | Fuller |
| 2017/0370960 | A1 | 12/2017 | Benning et al. |
| 2017/0374296 | A1 | 12/2017 | Schmidt |
| 2018/0183404 | A1 | 6/2018 | Jourdan et al. |
| 2018/0275080 | A1 | 9/2018 | Essawy et al. |
| 2018/0275085 | A1 | 9/2018 | Fok et al. |
| 2018/0275181 | A1 | 9/2018 | Essawy et al. |
| 2018/0275182 | A1 | 9/2018 | Essawy et al. |
| 2018/0275183 | A1 | 9/2018 | Essawy et al. |
| 2018/0275184 | A1 | 9/2018 | Essawy et al. |
| 2018/0275185 | A1 | 9/2018 | Essawy et al. |

FOREIGN PATENT DOCUMENTS

| | | |
|---|---|---|
| CN | 109246868 A | 1/2019 |
| CN | 109521252 A | 3/2019 |
| EP | 1441429 A1 | 7/2004 |
| EP | 2755443 A2 | 7/2014 |
| EP | 3018057 A1 | 5/2016 |
| EP | 3281874 A1 | 2/2018 |
| GB | 809608 | 2/1959 |
| GB | 8884415 | 12/1961 |
| JP | 2006088391 A | 4/2006 |
| JP | 20121968123 A | 10/2012 |
| KR | 20110124542 A | 11/2011 |
| KR | 101110789 B1 | 2/2012 |
| KR | 20120062301 A | 6/2012 |
| WO | 09011532 A1 | 10/1990 |
| WO | 09816837 A1 | 4/1998 |
| WO | 9943066 A1 | 8/1999 |
| WO | 2011026740 A1 | 3/2011 |

OTHER PUBLICATIONS

Extended European Search Report for European Patent Application No. 19216276.6, dated Jul. 6, 2020, 10 pages.
Bechhoefer, John, et al. "Temperature Dependence of the Capacitance of a Ferroelectric Material." in: American Journal of Physics (2007), vol. 75, No. 11, pp. 1046-1053.
Extended European Search Report for European Patent Application No. 18153822.4, dated May 17, 2018, 9 pages.
Communication Pursuant to Article 94(3) EPC for European Patent Application No. 18153822.4, dated Jan. 16, 2020, 4 pages.
Extended European Search Report for European Patent Application No. 18153825.7, dated Apr. 9, 2018, 7 pages.
Extended European Search Report for European Patent Application No. 19207401.1, dated Jan. 27, 2020, 8 pages.

(56) References Cited

OTHER PUBLICATIONS

Extended European Search Report for European Patent Application No. 18153830.7, dated May 23, 2018, 9 pages.
Extended European Search Report for European Patent Application No. 18153832.3, dated May 24, 2018, 9 pages.
Extended European Search Report for European Patent Application No. 19205621.6, dated Nov. 22, 2019, 9 pages.
Extended European Search Report for European Patent Application No. 18153834.9, dated May 29, 2018, 9 pages.
Extended European Search Report for European Patent Application No. 19203208.4, dated Nov. 18, 2019, 7 pages.
Extended European Search Report for European Patent Application No. 18153824.0, dated May 17, 2018, 9 pages.
Communication Pursuant to Article 94(3) EPC for European Patent Application No. 18153824.0, dated Jun. 12, 2019, 7 pages.
Communication Pursuant to Article 94(3) EPC for European Patent Application No. 18153824.0, dated Jan. 16, 2020, 5 pages.
Extended European Search Report for European Patent Application No. 18162251.5, dated Jul. 5, 2018, 9 pages.
Communication Pursuant to Article 94(3) EPC for European Patent Application No. 18162251.5, dated Jun. 12, 2019, 3 pages.
Cedric Gillet and Andreas Freidrich, "Guidelines for Designing a Concentrator for High-Current Sensing Applications with an Allegro Hall-Effect Sensor IC", 2013, 7 pages.
Magnetics Division of Sprang & Company, Technical Bulletin "Magnetic Cores for Hall Effect Devices", 1997, 6 pages.

\* cited by examiner

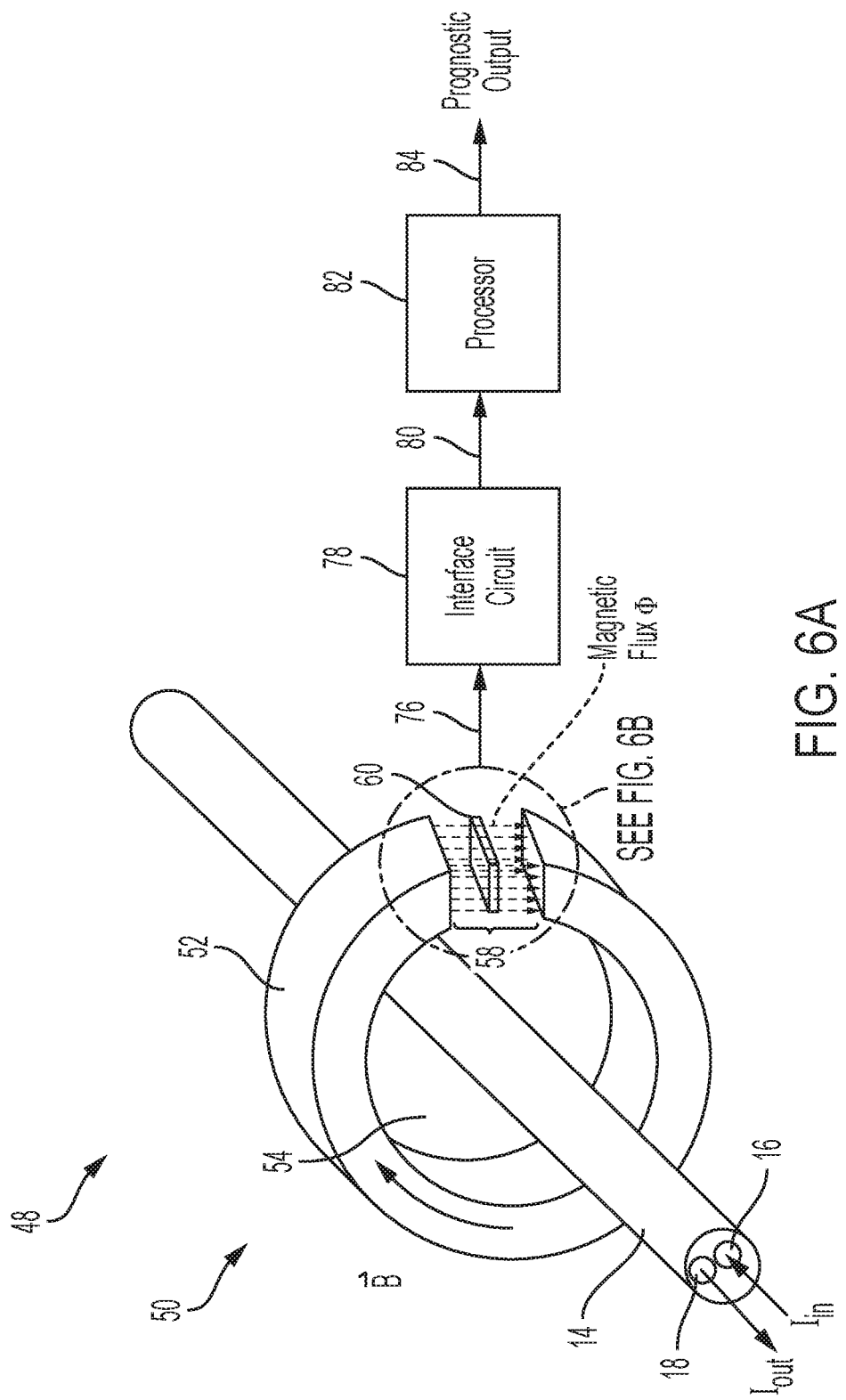

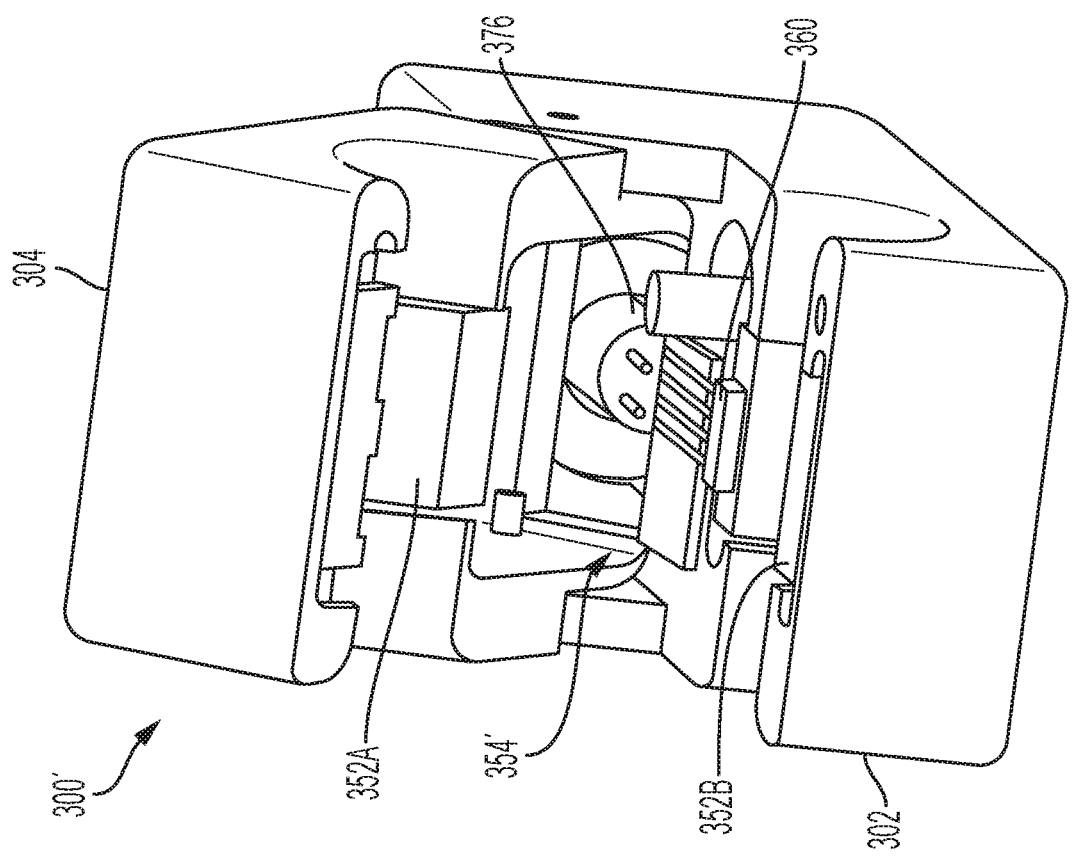
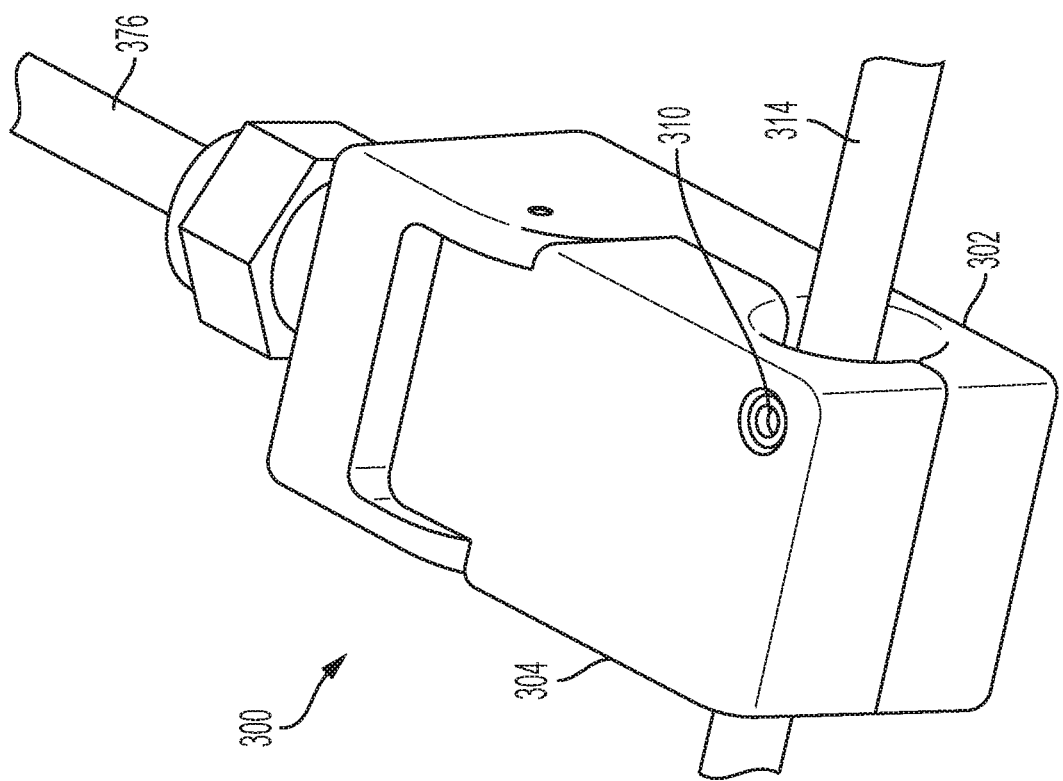

DIFFERENTIAL LEAKAGE CURRENT MEASUREMENT FOR HEATER HEALTH MONITORING

CROSS-REFERENCE TO RELATED APPLICATION(S)

This application is related to U.S. patent application Ser. No. 16/425,695, entitled "DIFFERENTIAL LEAKAGE CURRENT MEASUREMENT FOR HEATER HEALTH MONITORING", filed May 29, 2019.

BACKGROUND

The present disclosure relates generally to probes, and in particular, to a system and method of measuring electrical leakage current in air data probe heaters.

Probes are utilized to determine characteristics of an environment. In aircraft systems, for example, air data probes may be implemented on the external portions of the aircraft to aid in determination of conditions such as airspeed, altitude, and angle of attack, among others. Air data probes are prone to ice accretion during flight, which can affect their performance. Accordingly, electrical heaters are integrated into modern air data probes for helping control ice build-up.

Being exposed to harsh environmental conditions and temperature extremes, the electric heaters in air data probes are prone to degradation over time, possibly leading to their ultimate failure. When an air data probe heater fails, the performance of the air data probe can be affected. Moreover, a failed air data probe can ground a flight, thereby impacting flight scheduling and flight operations cost. It is desirable to be able to measure electrical leakage current during operation of air data probe heaters to help predict when an air data probe heater will require replacement, thereby mitigating the aforementioned impact on an aircraft's operation.

SUMMARY

A system for monitoring leakage current in a heater connected to a heater power supply by a power cable. The power cable has a first power lead conducting an inlet current defining an inlet current direction and a second power lead conducting an outlet current defining an outlet current direction that is opposite the inlet current direction. The system includes a differential current electromagnetic sensor having a magnetic core defining a center region that the power cable is configured to pass through one or more times. The magnetic core includes an air gap, and a magnetic flux sensing device positioned in the air gap. The magnetic flux sensing device is configured to provide a magnetic flux signal that is representative of a magnetic flux across the air gap, whereby the magnetic flux across the air gap is indicative of a difference between the inlet current and the outlet current, and the difference between the inlet current and the outlet current defines the leakage current.

A method for monitoring leakage current in a heater connected to a heater power supply by a power cable. The power cable has a first power lead conducting an inlet current defining an inlet current direction and a second power lead conducting an outlet current defining an outlet current direction that is opposite the inlet current direction. The power cable traverses a center region of a magnetic core that has an air gap that is configured to accommodate a magnetic flux sensing device positioned therein. The magnetic flux sensing device is configured to provide a magnetic flux signal that is representative of a magnetic flux across the air gap, whereby the magnetic flux is indicative of a difference between the inlet current and the outlet current. The method includes supplying electrical power from a power source to a heater via the power cable whereby the inlet current flows through the first power lead and the outlet current flows through the second power lead, providing electrical power to the magnetic flux sensing device, receiving the magnetic flux signal from the magnetic flux sensing device whereby the magnetic flux signal is indicative of the magnetic flux across the air gap, and producing an output signal that is representative of the magnetic flux across the air gap. The difference between the inlet current and the outlet current defines a leakage current.

BRIEF DESCRIPTION OF THE DRAWINGS

FIG. 6A is a schematic diagram of the differential current electromagnetic sensor shown in FIG. 5.

FIG. 9A is a perspective view of a second embodiment a heater cable sensor clamp in a closed position.

FIG. 9B is a perspective view of the heater cable sensor clamp shown in FIG. 9A in an open position.

DETAILED DESCRIPTION

Figure 1:
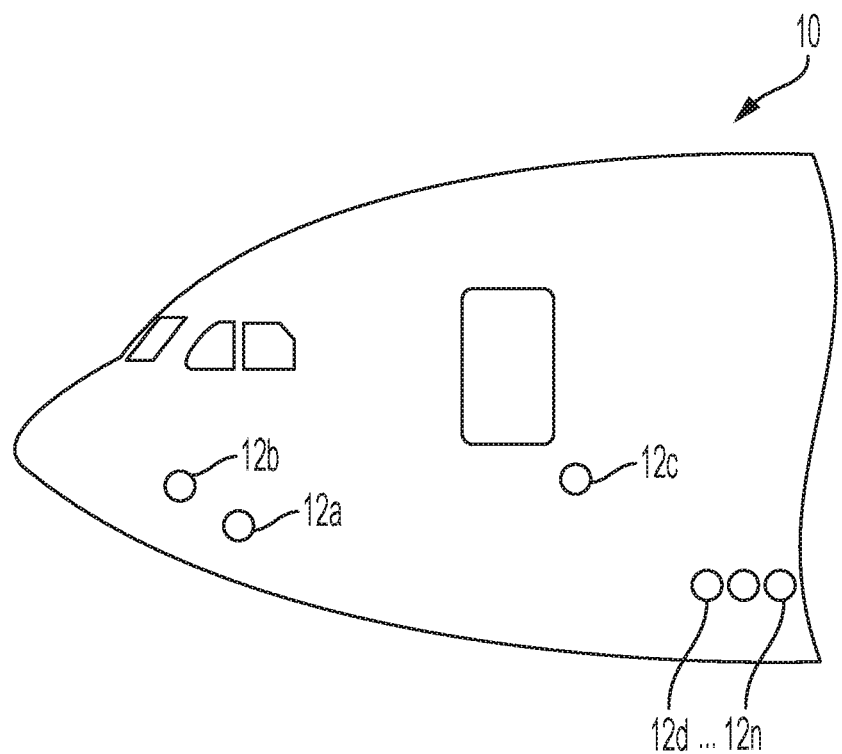
FIG. 1 is a schematic diagram illustrating an aircraft that includes a plurality of air data probes.

FIG. 1 is a schematic diagram illustrating aircraft 10 that includes a plurality of air data probes 12a-12n. Air data probes 12a-12n can be any type of probe with non-limiting examples including pitot probes, pitot-static probes, total air temperature (TAT) probes, or angle-of-attack (AOA) sensors. Any number n of air data probes can be included on a particular aircraft, with each air data probe 12a-12n typically including an integrated heater to control icing. As used in the present disclosure, one of any air data probes 12a-12n can be referred to as air data probe 12. The exemplary embodiment shown in FIG. 1 is a commercial fixed-wing aircraft. Air data probe 12 can be used on other vehicles, with non-limiting examples including military aircraft, rotary wing aircraft, unmanned aerial vehicles, spacecraft, and ground vehicles.

Figure 2A:
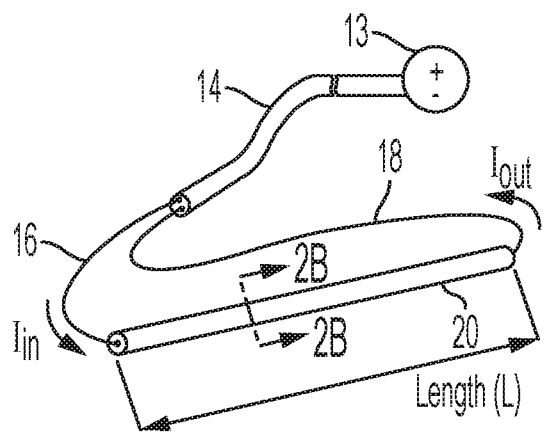
FIG. 2A is a schematic diagram of an air data probe heater circuit.

FIG. 2A is a schematic diagram of an air data probe heater circuit. Shown in FIG. 2A are aircraft power supply 13, power cable 14, first power lead 16, second power lead 18, and heater 20. Also labeled in FIG. 2A are inlet current $I_{in}$, outlet current $I_{out}$, and length L (i.e., heater length). Aircraft power supply 13 provides electrical power via power cable 14. In an exemplary embodiment, aircraft power supply 13 provides direct current at 28 VDC. In some embodiments, aircraft power supply 13 can provide a voltage different from this. In other embodiments, aircraft power supply 13 can provide an alternating current (AC) voltage. An exemplary AC frequency that can be provided by aircraft power supply 13 include is 400 Hz. First power lead 16 and second power lead 18 together provides an electrical connection to heater 20, thereby allowing electrical current to flow through heater 20. Heater 20 can be referred to as an air data probe heater. In a typical embodiment, heater 20 can consume 200-300 Watts in converting electrical power into thermal power. In some embodiments, heater 20 can draw an electrical power level that is different form this. Heater 20 is typically integrated into air data probe 12, and is energized (i.e., powered) to reduce or prevent ice formation on the respective air data probe by raising the surface temperature of the air data probe to a value that can melt and/or control the formation of ice on air data probe 12. Inlet current $I_{in}$ flows into heater 20 through first power lead 16, and outlet current $I_{out}$ flows from heater 20 through second power lead 18, as shown in FIG. 2A. The directions of current flow $I_{in}$, $I_{out}$ are illustrative, using a convention that is used in the electrical art. Under ideal circumstances, $I_{in}$ and $I_{out}$ are approximately equivalent, meaning that there is no other path for current to flow from heater 20. However, heater 20 is prone to failure, as will be described in detail later in FIGS. 3-4. A failure of heater 20 will generally occur at a point along the length L of heater 20, with a failure of heater 20 typically requiring a replacement of the associated air data probe. It is to be appreciated that the illustrated embodiment is greatly simplified, and associated control circuitry, circuit breakers, and the like are not shown. Heater 20 is depicted as a straight element for ease of illustration but can have other physical configurations in various embodiments. The values provided for power supply voltage and frequency, and heater power consumption, are exemplary and can be different in various embodiments. Power cable 14, first power lead 16, second power lead 18, and heater 20 can be referred to as a heating arrangement.

Figure 2B:
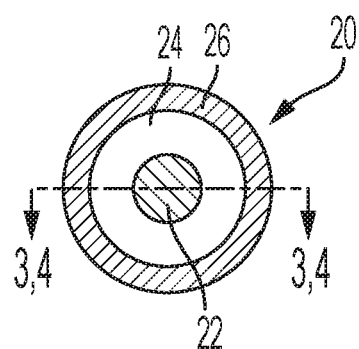
FIG. 2B is a cross-sectional view of the air data probe heater taken along line 2B-2B of FIG. 2A.

FIG. 2B is a cross-sectional view of an air data probe heater taken along line 2B-2B of FIG. 2A. Shown in FIG. 2B are heater 20, resistive heating element 22, insulation 24, and sheath 26. In the illustrated embodiment, resistive heating element 22 is made of an oxidation-resistant alloy. Insulation 24 surrounds resistive heating element 22. Insulation 24 is an electrically insulating material that provides heat conduction outward from resistive heating element 22. Sheath 26 is an oxidation-resistant metallic material that surrounds insulation 24, thereby containing insulation 24 while providing thermal conductivity from heater 20 to the air data probe in which heater 20 is installed. Sheath 26 can be referred to as a metallic sheath. It is to be appreciated that the various materials are selected to provide various desirable properties (e.g., strength, thermal conductivity, oxidation resistance), while also optimizing service life. Notwithstanding, heater 20 is prone to failure over time, as will be described in more detail in FIGS. 3-4.

Figure 3:
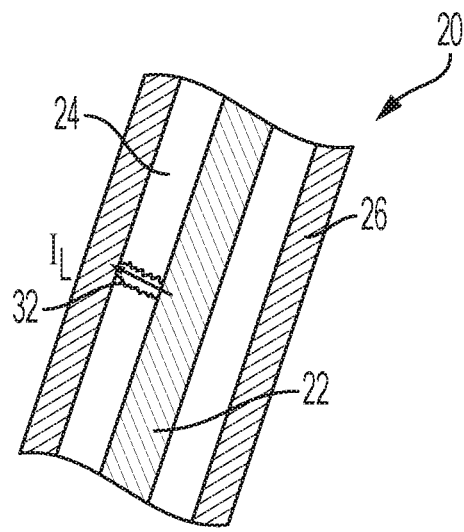
FIG. 3 is a partial cross-sectional view illustrating the air data probe heater with compromised insulation taken along line 3-3 of FIG. 2B.
Figure 4:
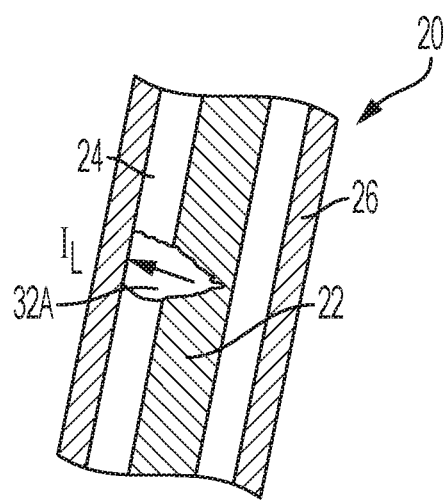
FIG. 4 is a partial cross-sectional view illustrating the air data probe heater with a compromised resistive heating element taken along line 4-4 of FIG. 2B.

FIG. 3 is a partial cross-sectional view illustrating heater 20 with compromised insulation 24 taken along line 3-3 of FIG. 2B. FIG. 4 is a partial cross-sectional view illustrating heater 20 with a compromised resistive heating element 22 taken along line 4-4 of FIG. 2B. FIGS. 3-4 illustrate an exemplary mode of failure of heater 20, as will be described, while other failure mechanisms for heater 20 can also occur in various embodiments. Shown in FIGS. 3-4 are heater 20, resistive heating element 22, insulation 24, sheath 26, and heater faults 32, 32A. If sheath 26 is compromised, contaminants can leak through sheath 26 to insulation 24, causing the material of insulation 24 to oxidize, change properties, and/or otherwise break down, thereby causing a path for leakage current $I_L$ to flow from resistive heating element 22 to sheath 26. Non-limiting examples of contaminants include oxygen, moisture, dust, carbon, fuel, oil, deicing fluid, and combustion products. Non-limiting examples of events that can compromise sheath 26 include external damage, latent defects, and fatigue failure (e.g., from vibration). Heater fault 32, shown in FIG. 3, depicts exemplary heater fault 32 that can result from the aforementioned failure mechanism. Leakage current $I_L$ flows through heater fault 32 from resistive heating element 22 to sheath 26, as shown. Over time, heater fault 32 can grow in magnitude, becoming heater fault 32A as shown in FIG. 4. An increase in the value of leakage current $I_L$ typically accompanies the progression of heater fault 32 over the life of heater 20. Moreover, the value of leakage current $I_L$ flowing through heater fault 32 affect the rate of deterioration of heater fault 32, with higher values of leakage current $I_L$ generally resulting in a greater rate of deterioration. Accordingly, if the value of leakage current $I_L$ for a particular heater fault 32 can be reduced, the rate of deterioration can be correspondingly reduced, thereby prolonging the useful life of heater 20. In some embodiments, reversing the electrical polarity of power supplied to heater 20 can reduce the rate of deterioration of heater fault 32, which can extend the life of heater 20.

Figure 5:
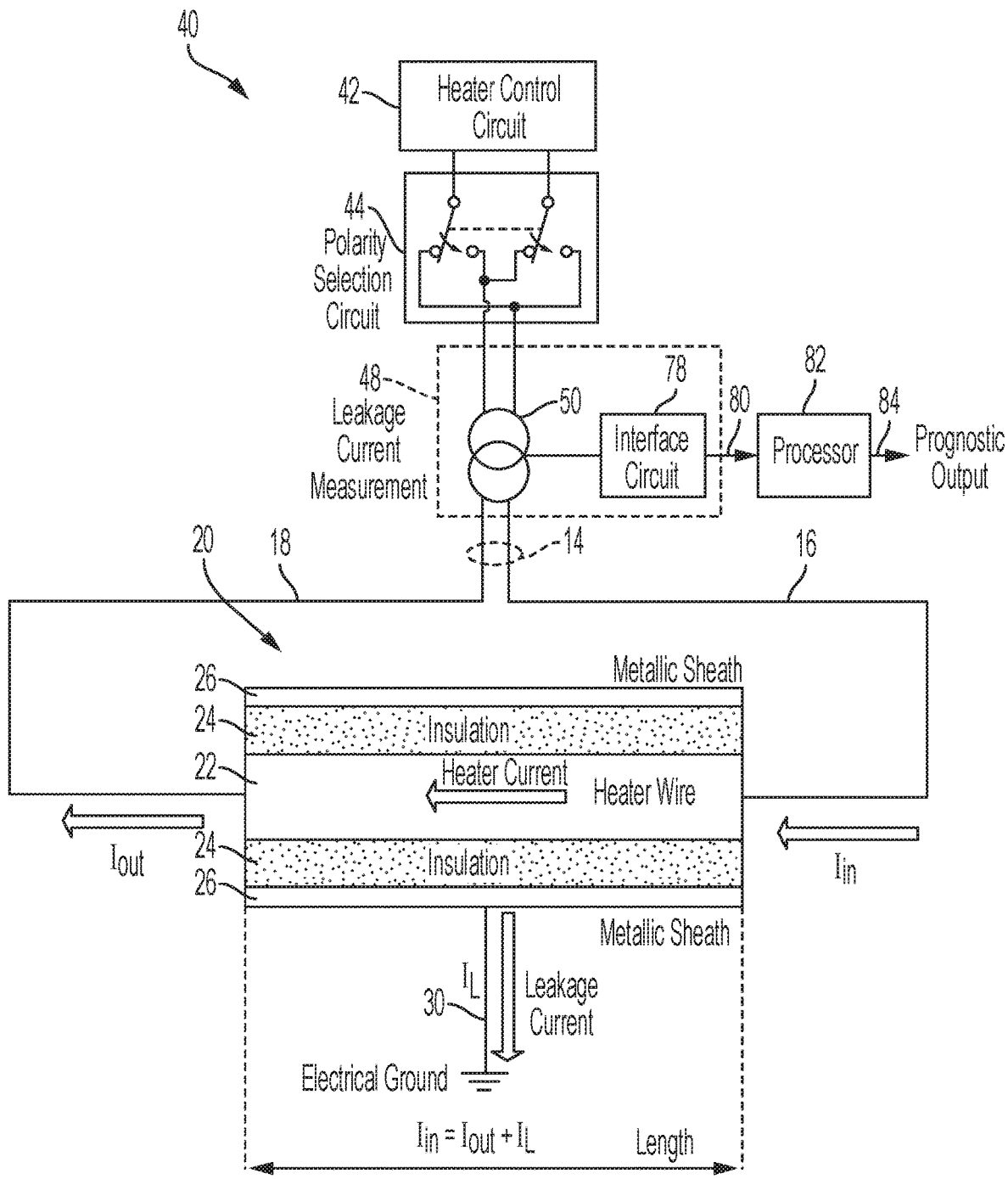
FIG. 5 is a schematic diagram of a heater monitoring circuit.

FIG. 5 is a schematic diagram of a heater monitoring circuit. Shown in FIG. 5 are power cable 14, first power lead 16, second power lead 18, heater 20, resistive heating element 22, insulation 24, sheath 26, leakage current path 30, control system 40, heater control circuit 42, polarity selection circuit 44, leakage current measurement system 48, leakage current detector 50, interface circuit 78, leakage current signal 80, processor 82, and prognostic data output 84. Also labeled in FIG. 5 are inlet current $I_{in}$, outlet current $I_{out}$, leakage current $I_L$, and length $I_{in}$. Power cable 14 is depicted schematically, representing an unspecified length of a two-or-more conductor cable that includes first power lead 16 and second power lead 18. The descriptions of aircraft power supply 13, power cable 14, first power lead 16, second power lead 18, and heater 20, resistive heating element 22, insulation 24, and sheath 26 are substantially as provided above in regard to FIGS. 2A-2B. Control system 40 provides monitoring of heater 20, as will be described. Accordingly, control system 40 can also be referred to as a heater monitoring circuit. Heater control circuit 42 receives a heater control signal (not shown) from an aircraft data system (not shown), thereby controlling the flow of electrical power from power supply 13 to heater 20 to control the accretion of ice on air data probe 12, as described above in regard to FIG. 2A. In an exemplary embodiment, the heater control signal can be generated in part based on the air temperature, aircraft airspeed, and liquid water content (LWC) that is measured by other systems (not shown) on aircraft 10, and heater control circuit 42 cycles electrical power on and off (i.e., power duty cycle control) to heater 20. Polarity selection circuit 44 controls the polarity of electrical power supplied to heater 20. In the illustrated embodiment, electrical polarity can be either "forward" or "reverse" polarity. The forward polarity can also be referred to as the normal polarity (i.e., as would exist in the absence of polarity selection circuit 44). Polarity selection circuit 44 can receive a polarity selection signal directing either the "forward" or "reverse" electrical polarity of power supplied to heater 20. The forward polarity can be referred to as a first polarity, and the reverse polarity can be referred to as a second polarity. In the illustrated embodiment, polarity selection circuit 44 is represented visually as a mechanical polarity-reversing circuit using a double-pole/double-throw (DPDT) electrical switch. In some embodiments, polarity selection circuit 44 can use electronic components (e.g., semiconductor devices) to reverse the electrical polarity. In some embodiments, polarity selection circuit 44 can be omitted from control system 40, such that heater 20 receives a fixed polarity of electrical power from heater control circuit 42 (i.e., as supplied from aircraft power supply 13). In some of these other embodiments, the electrical polarity of power supplied to heater 20 can be manually reversed, for example, by switching power leads during a maintenance operation while aircraft 10 is not operating.

When heater 20 is operating normally, inlet current $I_{in}$, flows into resistive heating element 22 (i.e., heater 20) through first power lead 16, and outlet current $I_{out}$ flows from resistive heating element 22 through second power lead 18, with $I_{in}$ being approximately equal to $I_{out}$ as described above in regard to FIG. 2A. A typical value of heater current flow (i.e., $I_{in}$, $I_{out}$) can range from about 1-3 amps (A), however these values can be different in other embodiments. A small amount of leakage current $I_L$ flows through leakage current path 30, schematically represented as flowing from sheath 26 to ground (i.e., chassis ground). The relationship between inlet current $I_{in}$, outlet current $I_{out}$, and leakage current $I_L$ can be calculated using Equation 1 as follows:

$$I_{in}=I_{out}+I_L \quad \text{Equation 1:}$$

It is to be appreciated that a properly functioning heater 20 will experience a nominal value of leakage current $I_L$ by virtue of the nature of insulation 24. When a newly-manufactured heater 20 (i.e., associated air data probe 12) is installed, the baseline value of leakage current $I_L$ is typically measured and recorded for each power supply polarity (i.e., forward and reverse). These values can be referred to as the baseline leakage current $I_{L-baseline}$, or as the leakage current $I_L$ at inception. A typical value of baseline leakage current $I_{L-baseline}$ can range from about 10-50 microamps (μA), but this value can vary over a wide range depending on the particular embodiment of heater 20. For example, in some embodiments, baseline leakage current $I_{L-baseline}$ can range up to about 2 milliamps (mA), or higher. In other embodiments, baseline leakage current $I_{L-baseline}$ can be less than 10 μA. As heater 20 operates, it is normal for leakage current $I_L$ to gradually increase as a result of minor degradation of insulation 24. The normal migration of environmental impurities (e.g., contaminants as discussed above in regard to FIGS. 3-4) into insulation 24 is an example of a typical degradation of insulation 24 over the lifetime of a particular heater 20. Because heater 20 is typically powered when an aircraft is flying, an expected heater lifetime can be expressed as a measure of flight hours. Several factors (e.g., physical size of heater 20, power consumption of heater 20, physical location of heater 20) can affect the expected lifetime of heater 20 in a particular embodiment, with typical values ranging from about 13K-100K flight hours. In some embodiments, the expected lifetime of heater 20 can exceed 100K hours.

Heater end-of-life (EOL) is typically associated with a particular threshold value $I_{L-threshold}$, which can vary depending on the particular embodiment of heater 20. Exemplary values of threshold value $I_{L-threshold}$ can range from about 2-50 mA, but this can vary in different embodiments. Accordingly, the remaining useful life (RUL) can be estimated from measured values of leakage current $I_L$ under each of the forward and reverse polarities. An object of the present disclosure is to provide a system and method of measuring the value of leakage current $I_L$ throughout the service life of heater 20 for each of the forward and reverse polarities of power supplied to heater 20, thereby providing an indication of RUL while also identifying an abnormal condition that could be indicative of a premature failure of heater 20. It is desirable to replace an air data probe (i.e., and associated heater 20) prior to the EOL or prior to the point of failure, to avoid an operational delay and interruption (ODI) that could result following a failure. On the other hand, because replacing air data probe 12 (i.e., and associated heater 20) can be expensive in terms of time and cost, while also removing associated aircraft 10 from operation, it is desirable to extract a maximum useful service life from heater 20 prior to the point of replacement.

Referring to FIG. 5 and Equation 1, the value of leakage current $I_L$ can be expressed in Equation 2 as being the difference between inlet current $I_{in}$ and outlet current $I_{out}$:

$$I_L=I_{in}-I_{out} \quad \text{Equation 2:}$$

Leakage current detector 50 is a differential current electromagnetic sensor. Leakage current measurement system 48 includes leakage current detector 50 and interface circuit 78, the operation of which will be described in greater detail in FIGS. 6A-6B. Leakage current measurement system 48 measures the value of leakage current $I_L$ in heater 20 under the particular polarity (i.e., forward or reverse), providing leakage current signal 80 to processor 82. In the illustrated embodiment, leakage current signal 80 is a digital signal that represents the measured value of leakage current $I_L$. Processor 82 calculates the value of value of leakage current $I_L$ based on leakage current signal 80. Processor 82 can also monitor and record the leakage current $I_L$ that is measured by leakage current measurement system 48 at the particular heater power polarity (i.e., forward or reverse) for each operating period (e.g., flight) of heater 20. In an exemplary embodiment, processor 82 can generate the polarity control signal that is provided to polarity selection circuit 44, as described above. In some embodiments, processor 82 can control polarity selection circuit 44 to optimize the lifetime of heater 20. Therefore, processor 82 can monitor the health of heater 20, while controlling the polarity of electrical power provided to heater 20, thereby extending the life of heater 20. Processor 82 can be referred to as a prognostic processor. Accordingly, processor 82 provides prognostic data output 84 which can be received by various consumers onboard aircraft 10 and/or external to aircraft 10. The remaining useful life (RUL) of heater 20 can be included in prognostic data output 84. In the illustrated embodiment, processor 82 is a digital processor that receives, stores, scales, and processes leakage current signal 80 (i.e., the digitized value of leakage current $I_L$) that is received throughout the lifecycle of heater 20, while associating leakage current signal 80 with the polarity of electrical power supplied to heater 20, flight hours, and so on. Therefore, processor 82 includes internal and/or connected memory and/or storage devices. Processor 82 can receive and process the digitized leakage current value continuously or periodically. In the illustrated embodiment, processor 82 can include one or more processors (not shown in FIG. 5) that are configured to implement functionality and/or process instructions for execution within processor 82. The one or more processors can be capable of processing instructions stored in one or more storage device(s) (not shown in FIG. 5). Examples of processors can include any one or more of: a microprocessor, a microcontroller, a digital signal processor (DSP), an application specific integrated circuit (ASIC), a field-programmable gate array (FPGA), or other equivalent discrete or integrated logic circuitry. In some embodiments, processor 82 can receive multiple inputs corresponding to multiple leakage current signals 80 from multiple associated heaters 20. In other embodiments, processor 82 can receive data from other aircraft data sources and/or perform other functions in addition to those described here. In any of these embodiments, processor 82 can be a neural network. In some embodiments, processor 82 can provide information regarding one or more heaters 20 with regard to the present and/or most recent values of leakage current $I_L$ for the forward and reverse polarities, the history of leakage current $I_L$ over time for each polarity (e.g., operating time, calendar time), the service life of heater 20 (e.g., operating time), the expected EOL, the calculated RUL, and status as to whether heater 20 is restricted in operation to a particular polarity. Collectively, these various data can be referred to as prognostic data. The aforementioned data can be provided to other systems (e.g., avionics system) for use by crew members. In these or other embodiments, prognostic data output 84 (i.e., prognostic data) can be transmitted and/or downloaded to engineering teams at an airline's operator, maintenance facility, and/or the various component suppliers whereby the data can be reviewed, analyzed, and/or archived. When installed on a system that includes one or more heaters 20, control system 40 can track the health of each of multiple heaters 20 aboard aircraft 10, allowing maintenance personnel to predict when failure of heaters 20 are likely to occur so that maintenance can be scheduled prior to the point of expected failure for any particular heater 20. This can avoid flight delays that could ground an aircraft for emergent maintenance requirements, and it can also help prevent the in-flight failure of a particular heater 20 which could be disruptive to the performance of an associated air data probe 12.

Figure 6B:
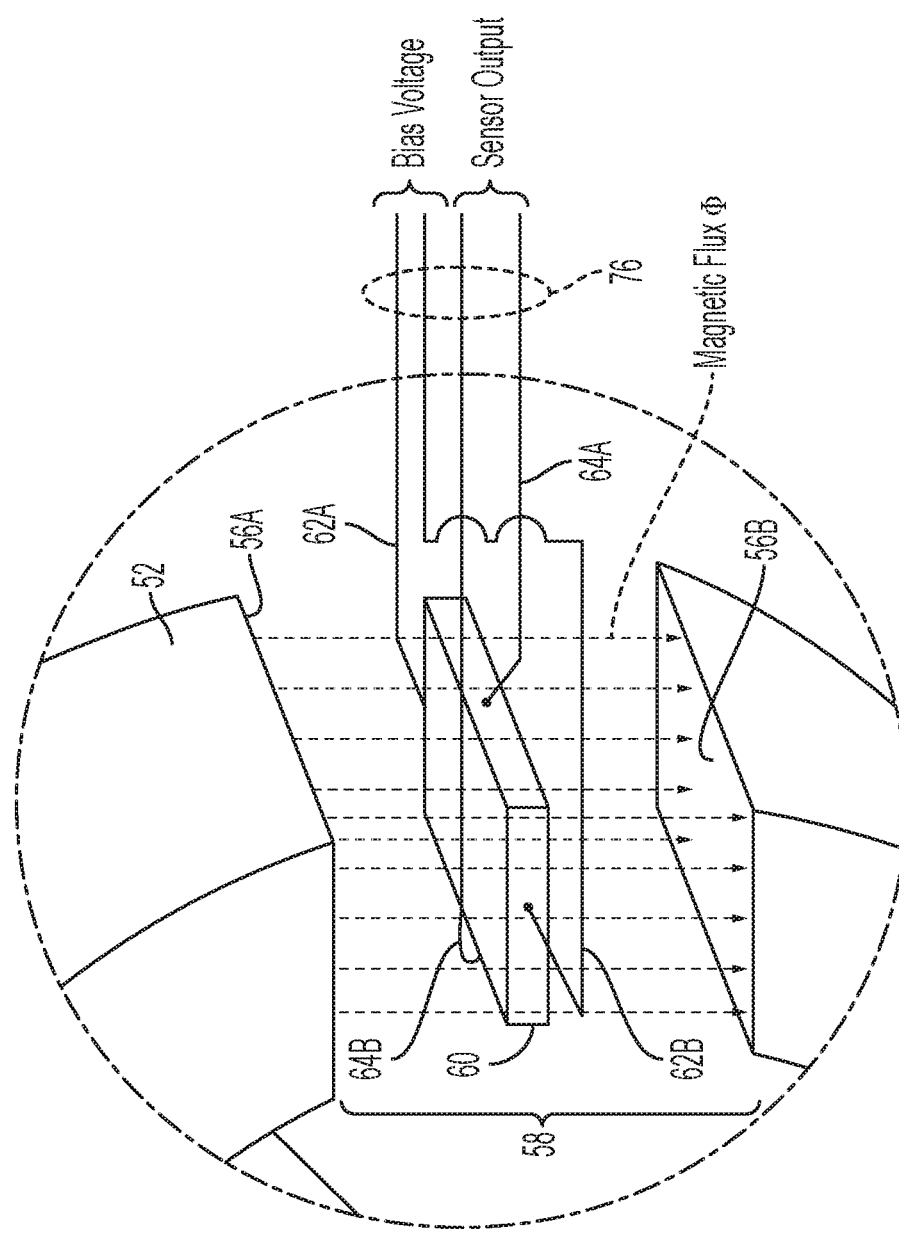
FIG. 6B is an enlarged perspective view showing the differential current magnetic flux sensor shown in FIG. 6A.

FIG. 6A is a schematic diagram of the differential current electromagnetic sensor shown in FIG. 5. FIG. 6B is an enlarged perspective view showing the differential current electromagnetic sensor shown in FIG. 6A. Shown in FIGS. 6A-6B are power cable 14, first power lead 16, second power lead 18, leakage current measurement system 48, differential current detector 50, toroid core 52, toroid center region 54, gap faces 56A, 56B, magnetic gap 58, magnetic flux sensing device 60, bias voltage connections 62A, 62B, sensor output connections 64A, 64B, sensing device cable 76, interface circuit 78, leakage current signal 80, processor 82, and prognostic data output 84. Also shown in FIGS. 6A-6B is the magnetic flux Φ across magnetic gap 58. Power cable 14 provides an electrical connection between polarity selection circuit 44 and heater 20, as shown and described above in regard to FIG. 5. First power lead 16 and second power lead 18 each include a central conductive core that is surrounded by an insulating material, together being held together by an outer cable sheath (not labeled) to form power cable 14. The insulating material on first and second power leads 16, 18, and the outer cable sheath, are all nonmetallic in the region near differential current detector 50, thereby providing negligible electromagnetic shielding. In some embodiments, the outer cable sheath on power cable 14 can be omitted. In these or other embodiments, first power lead 16 and second power lead 18 can be twisted together, or they can be untwisted. Toroid core 52 defines toroid center region 54, thereby providing for the passage of wires, cables, and the like. Power cable 14 can be described as passing through toroid center region 54, as shown in FIG. 6A. Power cable 14 can also be described as traversing toroid center region 54. Toroid core 52 is a gapped iron core transformer. In an exemplary embodiment, toroid core 52 is a ferrite core, made from a material that has a relatively high value of magnetic permeability, as may be commonly used in the electrical art as a transformer core. Toroid core 52 can also be referred to as a gapped circular transformer core. In some embodiments, toroid core can be made from other materials that are capable of creating magnetic flux Φ across magnetic gap 58. Magnetic flux sensing device 60 is positioned in magnetic gap 58, whereby magnetic flux Φ passes through magnetic flux sensing device 60. Components that hold toroid core 52 in place, and that hold magnetic flux sensing device 60 in position in magnetic gap 58 are not shown in FIGS. 6A-6B but will be shown and described later in FIGS. 8A-8B and 9A-9B.

It is known in the electrical art that an electrical current flowing in a conductor passing through a ferrite core induces a magnetic field B, thereby creating a magnetic flux Φ through magnetic gap 58. The magnetic field B can also be annotated with a vector symbol, as shown in FIG. 6A. If the electrical current is a direct current (DC), as in the illustrated embodiment, then magnetic field B and associated magnetic flux Φ will be relatively constant for a particular condition of heater 20. As electrical power is delivered to heater 20 by power cable 14 (e.g., as shown in FIG. 5), inlet current $I_{in}$ flows through power cable 14 in a direction that is opposite to that of outlet current $I_{out}$, with both inlet current $I_{in}$ and outlet current $I_{out}$ flowing through toroid center region 54. Accordingly, the component of magnetic field B associated with inlet current $I_{in}$ is opposite in direction to the component of magnetic field B associated with outlet current $I_{in}$, thereby providing a canceling effect. The net magnetic field B and magnetic flux Φ across magnetic gap 58 is a result of the difference between inlet current $I_{in}$ and outlet current $I_{out}$. Accordingly, magnetic flux sensing device 60 detects a value of magnetic flux Φ that is related to the difference between inlet current $I_{in}$ and outlet current $I_{out}$. If inlet current $I_{in}$ were equal to outlet current $I_{out}$ (i.e., $I_{in}=I_{out}$), then the resulting magnetic flux Φ would be zero because the respective components of magnetic fields B from inlet current $I_{in}$ and outlet current $I_{out}$ are equal in magnitude but opposite in direction. Because leakage current $I_L$ is non-zero as a result of the properties of heater 20, as described above in regard to FIG. 5 and as shown in Equation 2, the resulting magnetic flux Φ passing through magnetic flux sensing device 60 is representative of the value of leakage current $I_L$. In embodiments where heater control circuit 42 provides an AC voltage to heater 20, then magnetic field B and associated magnetic flux Φ will be alternating (i.e., time-varying). Magnetic gap 58 can also be referred to as an air gap.

In the illustrated embodiment, magnetic flux sensing device 60 is a Hall effect sensor that produces an output voltage representative of the value of magnetic flux Φ passing therethrough (i.e., magnetic flux Φ across magnetic gap 58). Interface circuit 78 provides a bias voltage to bias voltage connections 62A, 62B on magnetic flux sensing device 60, and interface circuit 78 receives an output voltage (i.e., the "Hall effect voltage") across sensor output connections 64A, 64B. Bias voltage connections 62A, 62B and sensor output connections 64A, 64B are routed as insulated conductors through sensing device cable 76. The output voltage from magnetic flux sensing device 60 is representative of the value of leakage current $I_L$ associated with heater 20. If heater control circuit 42 provides a DC voltage to heater 20, as in the illustrated embodiment, then the output voltage across sensor output connections 64A, 64B will typically be DC value. Throughout the lifecycle of heater 20, polarity selection circuit 44 can reverse the polarity of electrical power supplied to heater 20, as described above in regard to FIG. 5. This polarity reversal will typically result in a reversal of the polarity of leakage current $I_L$, and correspondingly, the direction of magnetic flux $\Phi$ passing through magnetic flux sensing device 60. Accordingly, in interface circuit 78 is configured to adjust the value and/or polarity of bias voltage supplied to bias voltage connections 62A, 62B to accommodate the reversal of magnetic flux $\Phi$. In some of these embodiments, interface circuit 78 can receive a signal from polarity selection circuit 44 or from a system providing a polarity selection signal to polarity selection circuit 44 to accommodate a shift in the output voltage across sensor output connections 64A, 64B as a result of the magnetic flux $\Phi$ reversal. In embodiments where an AC voltage is supplied to heater 20, an alternating magnetic flux $\Phi$ will exist across magnetic gap 58 as described above. In these embodiments, interface circuit 78 can be configured to provide a proper value of bias voltage supplied to bias voltage connections 62A, 62B, and/or to receive and process a corresponding time-varying output voltage across sensor output connections 64A, 64B to calculate the corresponding value of leakage current $I_L$. The descriptions of interface circuit 78, leakage current signal 80, processor 82, and prognostic data output 84 are as provided above in regard to FIG. 5.

Figure 7:
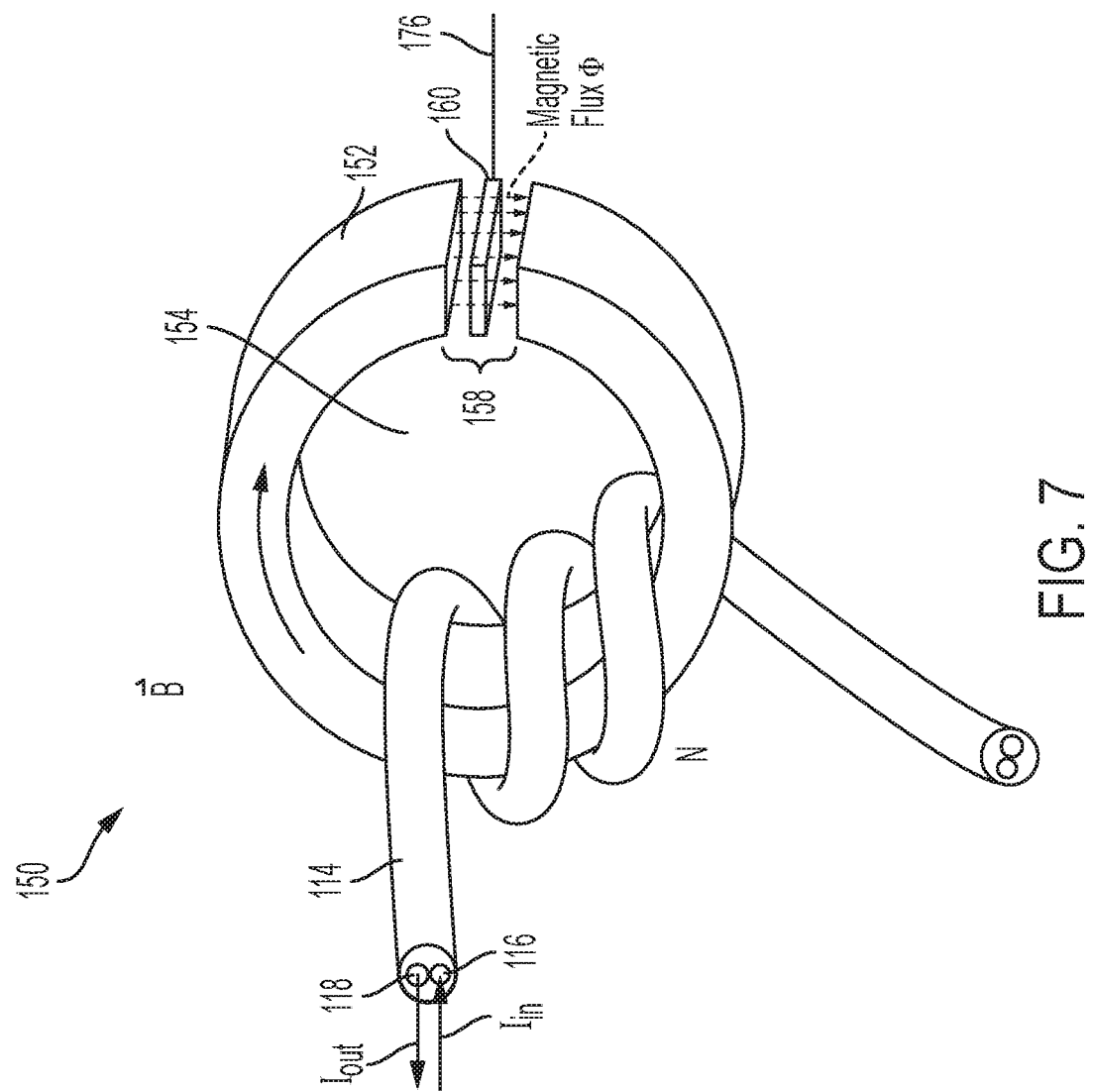
FIG. 7 is a schematic diagram of a second embodiment of the differential current electromagnetic sensor shown in FIG. 5.

FIG. 7 is a schematic diagram of a second embodiment of differential current detector 50 shown in FIG. 5. Shown in FIG. 7 are power cable 114, first power lead 116, second power lead 118, toroid core 152, toroid center region 154, magnetic gap 158, magnetic flux sensing device 160, and sensing device cable 176, all having descriptions substantially similar to those provided above in regard to FIGS. 6A-6B. In the illustrated embodiment, power cable 114 passes through toroid center region 154 three times (i.e., N=3). The number of turns N can be said to be three, and the resulting magnetic field B for a particular value of leakage current $I_L$ will be approximately three times the value of that produced by a single pass through toroid center region 154 (e.g., as shown in FIG. 6A). Accordingly, the value of magnetic flux $\Phi$ will be about three times as great across magnetic gap 158 (i.e., air gap) for a given value of leakage current $I_L$ as compared to that for a single turn (i.e., N=1). The illustrated embodiment shown in FIG. 7 can be beneficial in providing a greater sensitivity in measuring leakage current $I_L$, thereby allowing smaller values of leakage current $I_L$ to be measured and processed by control system 40. This can improve the sensitivity of differential current detector 150 to smaller values of leakage current $I_L$, and/or can improve the measurement resolution of differential current detector 150.

The embodiment shown in FIG. 7 is exemplary, and in various embodiments practically any number of turns N can be used. For example, in some embodiments, differential current detector 150 can include two turns (N=2). In other embodiments, differential current detector 150 can include four or more turns N. In some embodiments, the number of turns N can range from about 10-20. In other embodiments, the number of turns N can be greater than 20. Various factors can influence the number of turns N used in a particular embodiment, with non-limiting examples including the physical sizes of power cable 14, 114 (i.e., including first and second power leads 16, 18, 116, 118), and the physical size of toroid core 52, 152. In the exemplary embodiments shown in FIGS. 6A-6B and 7, first and second power leads 16, 18, 116, 118 can each have a wire size of 16 AWG (1.31 $mm^2$ cross-sectional area), power cable 14, 114 can have an outside diameter (not labeled) of about 0.25 inch (6.4 mm), and toroid core 52, 152 can have an inside diameter (not labeled) of about 0.5 inch (12.7 mm). All sizes of power cable 14, 114 (including first and second power leads 16, 18, 116, 118) and toroid core 52, 152 are within the scope of the present disclosure. In some embodiments, power cable 14, 114 can include more than two conductors (i.e., first and second power leads 16, 18, 116, 118). In these or other embodiments, power cable 14, 114 can be sheathed (e.g., braided metallic sheath) in regions other than in the vicinity of toroid core 52, 152.

In some embodiments, toroid core 52, 152 can include a split (not shown in FIGS. 6A and 7) that can allow toroid core 52, 152 to be temporarily opened and/or separated into two halves to allow differential current detector 50, 150 to be installed on an existing power cable 14, 114, with various means being used to hold toroid core 52, 152 together. The resulting apparatus can be described as a clamp that can be placed around an existing power cable 14, 114. In these or other embodiments, toroid core 52, 152 can be replaced with a magnetic core having a physical shape that is non-toroid (i.e., non-circular). In any of these or any other embodiment, toroid core 52, 152 can be referred to as a magnetic core. Non-limiting exemplary non-toroid shapes include oval, elliptical, hexagonal, pentagonal, square, and rectangular. Moreover, magnetic cores having geometric shapes that involve more than a single opening (i.e., single magnetic flux circuit) can also be used, with non-limiting examples including E-cores and EI-cores. An embodiment of an EI-core will be shown later in FIG. 10. Any non-toroid shape can include one or more flux-shaping features. An exemplary flux-shaping feature is rounded corners on a square magnetic core.

Figure 8B:
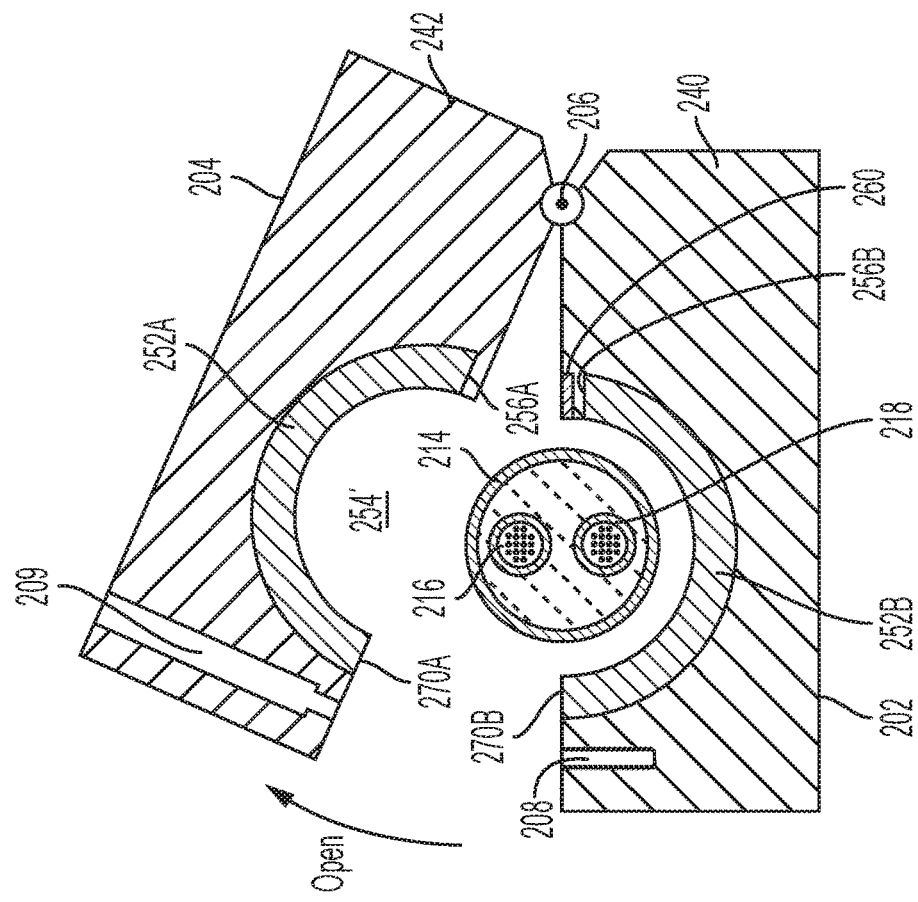
FIG. 8B is a cross-sectional view showing the heater cable sensor clamp shown in FIG. 8A in an open position.
Figure 8A:
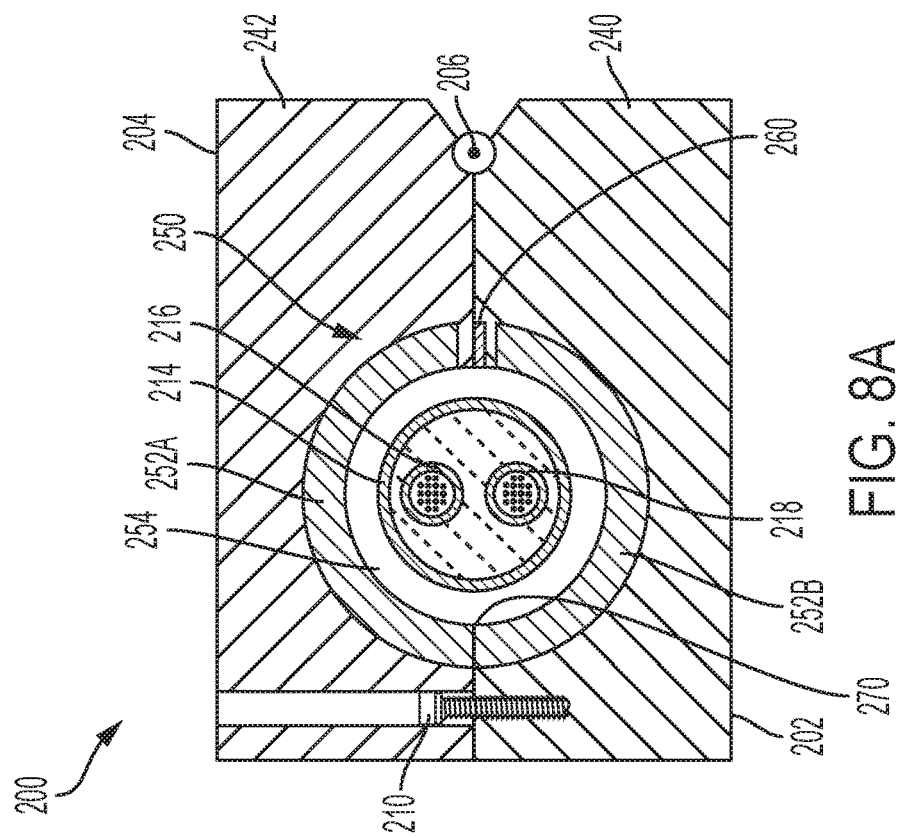
FIG. 8A is a cross-sectional view showing a heater cable sensor clamp for a differential current electromagnetic sensor in a closed position.

FIG. 8A is a cross-sectional view showing a heater cable sensor clamp for a differential current electromagnetic sensor in a closed position. FIG. 8B is a cross-sectional view showing the heater cable sensor clamp shown in FIG. 8A in an open position. Shown in FIGS. 8A-8B are clamp fixture 200, base assembly 202, upper assembly 204, hinge 206, base assembly cavity 208, upper assembly port 209, locking device 210, power cable 214, first power lead 216, second power lead 218, base assembly housing 240, upper assembly housing 242, differential current detector 250, toroid core upper portion 252A, toroid core base portion 252B, toroid center region 254, 254', gap faces 256A, 256B, magnetic flux sensing device 260, toroid core split 270, upper portion face 270A, and base portion face 270B. Clamp fixture 200 includes base assembly 202 and upper assembly 204 which can rotate open and close about hinge 206. Base assembly cavity 208 accommodates locking device 210 which passes through upper assembly port 209. An exemplary locking device 210 is a threaded fastener that matably engages with threads on base assembly cavity 208. The descriptions of power cable 214, first power lead 216 and second power lead 218 are substantially similar to those provided above in regard to FIGS. 2A, 5, and 7. In the detail shown in FIGS. 8A-8B, first and second power leads 216, 218 include stranded conductors that are surrounded by a sheath (not labeled), while including additional fill material (not labeled) within the outer sheath (not labeled) of power cable 214. In some embodiments, first and/or second power leads 216, 218 can be a solid conductor. In these or other embodiments, power cable can exclude the fill material, the sheath, or both. In some embodiments, power cable 214 can include additional wires and/or components.

Referring again to FIGS. 8A-8B, differential current detector 250 includes a split toroid core having toroid core upper portion 252A and toroid core base portion 252B, which together define toroid center region 254 (when closed) and toroid center region 254' (when not in a closed position). The magnetic gap (i.e., air gap) (not labeled in FIGS. 8A-8B) is defined by gap faces 256A, 256B when clamp fixture is in a closed position. The descriptions of the magnetic gap and of magnetic flux sensing device 260 are substantially similar to that provided above in regard to FIGS. 6A-6B. Toroid core split 270 is defined by upper portion face 270A and base portion face 270B. When clamp fixture 200 is in an open position (i.e., as shown in FIG. 8B), the separation between upper portion face 270A and base portion face 270B (not labeled) is sufficient to accommodate the insertion of removal of power cable 214, thereby accommodating the placement of clamp fixture 200 on an existing power cable 214. This can be beneficial in facilitating the installation and/or removal of clamp fixture 200 on an existing power cable 214 (i.e., when heater 20 and associated wiring is in place on aircraft 10 prior to utilizing clamp fixture 200). When clamp fixture 200 is in a closed position (i.e., as shown in FIG. 8A), upper portion face 270A makes physical contact with base portion face 270B, thereby maximizing the transfer of magnetic flux $\Phi$ across toroid split 270. In some embodiments, when clamp fixture 200 is in a closed position, a magnetic gap may exist between upper portion face 270A and base portion face 270B. In these embodiments, the magnetic gap between upper portion face 270A and base portion face 270B could be referred to as a second magnetic gap (i.e., second air gap), and the magnetic gap between gap faces 256A, 256B could be referred to as a first magnetic gap (i.e., first air gap). In some embodiments, it can be preferable to minimize the size of the second magnetic gap. It is to be appreciated that when upper portion face 270A makes physical contact with base portion face 270B, the second magnetic gap is effectively eliminated from the magnetic circuit that includes toroid core upper portion 252A and toroid core base portion 252B.

FIG. 9A is a perspective view of a second embodiment a heater cable sensor clamp in a closed position. FIG. 9B is a perspective view of the heater cable sensor clamp shown in FIG. 9A in an open position. Shown in FIGS. 9A-9B are clamp fixture 300, base assembly 302, upper assembly 304, locking device 310, power cable 314, toroid core upper portion 352A, toroid core base portion 352B, toroid center region 354', magnetic flux sensing device 360, and sensing device cable 376. The descriptions of clamp fixture 300, base assembly 302, upper assembly 304, locking device 310, power cable 314, toroid core upper portion 352A, toroid core base portion 352B, toroid center region 354', and magnetic flux sensing device 360 are similar to those provided above in regard to FIGS. 8A-8B. Some of the features shown in FIGS. 8A-8B are not labeled in FIGS. 9A-9B for ease of illustration. The description of sensing device cable 376 is similar to that provided above in regard to FIGS. 6A-6B. In the illustrated embodiment, sensing device cable 376 provides an electrical connection between clamp fixture (i.e., magnetic flux sensing device 360) and an interface circuit (not shown in FIGS. 9A-9B). In some embodiments, the interface circuit, or portions of the interface circuit, can be included in clamp fixture 300. In an exemplary embodiment, a cable could provide electrical power to an interface circuit that is housed within clamp fixture 300, and the same cable, or a different cable, could transmit the leakage current signal from clamp fixture 300 to a processor.

Figure 10:
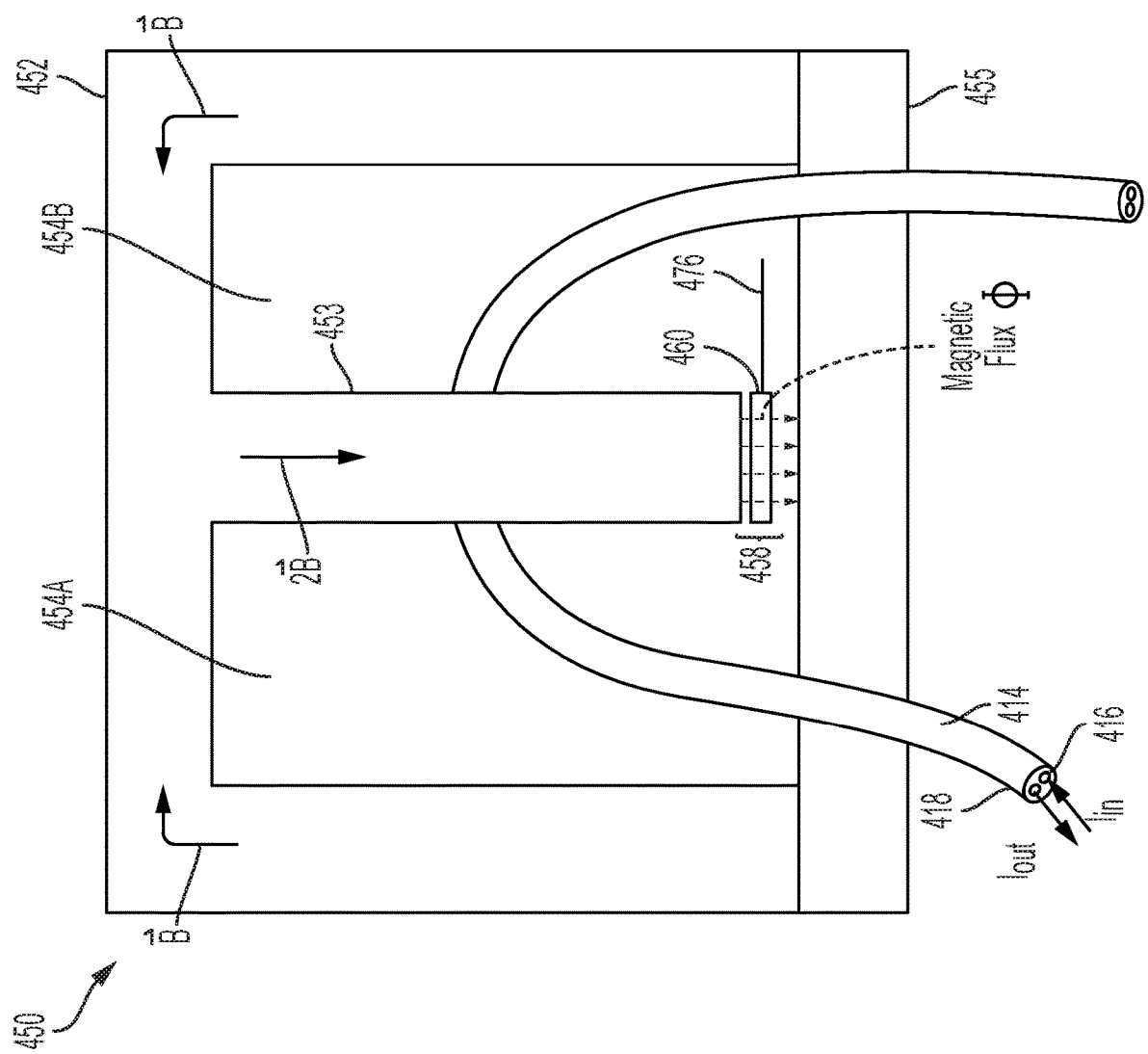
FIG. 10 is a side view of a third embodiment of the differential current electromagnetic sensor shown in FIG. 5.

FIG. 10 is a side view of a third embodiment of differential current detector 50 shown in FIG. 5. Shown in FIG. 10 are power cable 414, first power lead 416, second power lead 418, differential current detector 450, E-core 452, center member 453, center regions 454A, 454B, I-core 455, magnetic gap 458, magnetic flux sensing device 460, and sensing device cable 476. Power cable 414, first power lead 416, second power lead 418, magnetic gap 458, magnetic flux sensing device 460, and sensing device cable 476 all have descriptions substantially similar to those provided above in regard to FIGS. 6A-6B. When mated together as shown in FIG. 10, E-core 452 and I-core 455 form an EI-core defining center regions 454A and 454B, through each of which power cable 414 passes as shown. In a manner similar to that described above in regard to FIGS. 6A-6B, the difference between inlet current $I_{in}$ and outlet current $I_{out}$ (i.e., leakage current $I_L$) creates magnetic field B in each of the outer members (not labeled) of E-core 452, together being directed through I-core 455 as shown. In the illustrated embodiment, the combined magnetic field in center member 453 is about 2B, being the sum of magnetic field B in each of the outer members, but this can be different because of flux leakage effects and the like. Accordingly, magnetic flux sensing device 460 senses magnetic flux $\Phi$ across magnetic gap 458 in a manner similar to that described above in regard to FIGS. 6A-6B. In some embodiments, an advantage of using an EI-core for differential current detector 450 is the relative ease of separating and/or joining E-core 452 and I-core 455, which can be beneficial in installing differential current detector 450 on an existing power cable 414. The EI-core differential current detector 450 shown in FIG. 10 can be used in some embodiments to provide a compact design that provides greater leakage current $I_L$ sensing capability than the toroid design shown in FIG. 6A. Moreover, in some embodiments, leakage current $I_L$ sensing capability can be further enhanced by passing power cable 414 through center regions 454A and/or 454B more than once. In an exemplary embodiment, power cable 414 can pass through center regions 454A, 454B three times, in a manner similar to that shown in FIG. 7. An EI-core is a non-limiting example of many possible geometric shapes that can be used to form the magnetic core of differential current detector 50, 150, 450.

In the various embodiments shown and described in FIGS. 6A-6B, etc., magnetic flux sensing device 60 is a Hall effect sensor. All other magnetic flux sensing devices are within the scope of the present disclosure. In an exemplary embodiment, magnetic flux sensing device 60 can be a magnetoresistive (MR) element. An MR element has an electrical resistance that varies in the presence of a magnetic flux $\Phi$. Accordingly, interface circuit 78 can be configured to drive a sensing current through magnetic flux sensing device 60 (i.e., an MR element) while measuring a resulting voltage drop across the MR element as being an indication of magnetic flux $\Phi$, and accordingly, of leakage current $I_L$. All types of MR sensors are within the scope of the present disclosure, with non-limiting examples including anisotropic magnetoresistance (AMR), tunnel-magnetoresistance (TMR), giant magnetoresistance (GMR) MR sensors. Moreover, all other types of magnetic flux sensors are within the scope of the present disclosure.

The exemplary embodiments shown and described in the present disclosure pertain to heaters on aircraft air data probes. The scope of the present disclosure includes heaters on all aircraft components, with non-limiting examples including fixed and rotary wings and aircraft control surfaces. Moreover, the scope of the present disclosure includes all electrical heaters that can be receive electrical power via two electrical leads (i.e., inlet current $I_{in}$ and outlet current $I_{out}$), without regard to power type (i.e., AC or DC), voltage, frequency, current, power, or location. Other exemplary power supply frequencies include 50 Hz and 60 Hz. Accordingly, leakage current detector 50, 150 can be used on one or more heaters 20 that are located or installed in any vehicle, building, or other location. Non-limiting examples of types of heaters that are within the scope of the present disclosure include wing ice protection heaters, water heaters, tank heaters, process heaters, stoves, ovens, and floor heaters that can be installed on aircraft, non-aircraft vehicles, buildings (e.g., residential, commercial, industrial, military), factories, and so on.

Discussion of Possible Embodiments

The following are non-exclusive descriptions of possible embodiments of the present invention.

A system for monitoring a leakage current in a heater connected to a heater power supply by a power cable, the power cable comprising a first power lead conducting an inlet current defining an inlet current direction and a second power lead conducting an outlet current defining an outlet current direction, the outlet current direction being opposite to the inlet current direction, the system comprising a differential current electromagnetic sensor, comprising a magnetic core defining a center region, wherein the magnetic core includes an air gap and the power cable is configured to pass through the center region one or more times; and a magnetic flux sensing device positioned in the air gap, the magnetic flux sensing device configured to provide a magnetic flux signal that is representative of a magnetic flux across the air gap; wherein the magnetic flux across the air gap is indicative of a difference between the inlet current and the outlet current, and the difference between the inlet current and the outlet current defines the leakage current.

The system of the preceding paragraph can optionally include, additionally and/or alternatively, any one or more of the following features, configurations and/or additional components:

A further embodiment of the foregoing system, further comprising an interface circuit configured to: provide electrical power to the magnetic flux sensing device; receive the magnetic flux signal from the magnetic flux sensing device, the magnetic flux signal indicative of the magnetic flux across the air gap; and produce an output signal that is representative of the magnetic flux across the air gap.

A further embodiment of the foregoing system, wherein the heater power supply provides a direct current to the heater.

A further embodiment of the foregoing system, wherein: the magnetic flux sensing device is a Hall effect sensor; the interface circuit provides a bias voltage to the Hall effect sensor; and the output signal is a voltage representative of the magnetic flux across the air gap.

A further embodiment of the foregoing system, wherein: the heater power supply provides an alternating current to the heater; the magnetic flux across the air gap is an alternating magnetic flux; and the interface circuit is configured to receive an alternating magnetic flux signal from the magnetic flux sensing device.

A further embodiment of the foregoing system, wherein: the magnetic flux sensing device is a magnetoresistive sensor; and the output signal is a resistance value representative of the magnetic flux across the air gap.

A further embodiment of the foregoing system, wherein the power cable forms two or more turns around the magnetic core, thereby passing through the center region two or more times, respectively.

A further embodiment of the foregoing system, wherein the heater comprises: a resistive heating element; electrical insulation surrounding the resistive heating element; and a metallic sheath surrounding the electrical insulation; wherein: the first current flows into the resistive heating element to provide heat; the second current flows out of the resistive heating element; the leakage current flows from the resistive heating element to the metallic sheath; and the first current is equal to the sum of the second current and the leakage current.

A further embodiment of the foregoing system, wherein the magnetic core is a toroidal core, a square core, or an EI-core.

A further embodiment of the foregoing system, further comprising a polarity selection circuit configured to applying to the heater either a first polarity heater voltage or a second polarity heater voltage.

A further embodiment of the foregoing system, wherein the power cable passes through the center region once.

A further embodiment of the foregoing system, further comprising a clamp fixture, wherein: the magnetic core further includes a split, thereby defining a first core piece and a second core piece; and the clamp fixture comprises: a first clamp piece, the first core piece and the magnetic flux sensing device disposed on the first clamp piece; a second clamp piece, the second core piece disposed on the second clamp piece; and a hinge assembly, configured to align the first clamp piece with the second clamp piece, wherein the magnetic core forms a magnetic circuit when the clamp fixture is in a closed position.

A further embodiment of the foregoing system, wherein the clamp fixture further comprises a locking mechanism, the locking mechanism configured to hold the clamp fixture in the closed position.

A further embodiment of the foregoing system, wherein: the heater is disposed on an aircraft component; and the aircraft component disposed on an external portion of an aircraft.

A further embodiment of the foregoing system, wherein: the heater is disposed on an aircraft component; the aircraft component disposed on an external portion of an aircraft; and the heater is configured to control ice formation on the aircraft component.

A method of monitoring a leakage current in a heater connected to a power supply by a power cable, the power cable comprising a first power lead conducting an inlet current defining an inlet current direction and a second power lead conducting an outlet current defining an outlet current direction, the outlet current direction being opposite to the inlet current direction, the power cable traversing a center region of a magnetic core, the magnetic core including an air gap that is configured to accommodate a magnetic flux sensing device positioned therein, the magnetic flux sensing device configured to provide a magnetic flux signal that is representative of a magnetic flux across the air gap, the magnetic flux indicative of a difference between the inlet current and the outlet current, the method comprising: supplying electrical power from a power source to a heater via the power cable, wherein: the inlet current flows through the first power lead; and the outlet current flows through the second power lead; providing electrical power to the magnetic flux sensing device; receiving the magnetic flux signal from the magnetic flux sensing device, the magnetic flux signal indicative of the magnetic flux across the air gap; and producing an output signal that is representative of the magnetic flux across the air gap; wherein the difference between the inlet current and the outlet current defines a leakage current.

The method of the preceding paragraph can optionally include, additionally and/or alternatively, any one or more of the following features, configurations and/or additional components:

A further embodiment of the foregoing method, wherein: the power source provides direct current to the heater; the magnetic flux sensing device is a Hall effect sensor; providing electrical power to the magnetic flux sensing device comprises providing a bias voltage to the Hall effect sensor; and the output signal is a voltage representative of the magnetic flux across the air gap.

A further embodiment of the foregoing method, wherein the power cable forms two or more turns around the magnetic core, thereby passing through the center region two or more times, respectively.

A further embodiment of the foregoing method, wherein: the power cable passes through the center region once; the magnetic core further includes a split, thereby defining a first core piece and a second core piece; and the clamp fixture comprises: a first clamp piece, the first core piece and the magnetic flux sensing device disposed on the first clamp piece; a second clamp piece, the second core piece disposed on the second clamp piece; and a hinge assembly, configured to align the first clamp piece with the second clamp piece, wherein the magnetic core forms a magnetic circuit when the clamp fixture is in a closed position.

A further embodiment of the foregoing method, wherein the magnetic core is a toroidal core, a square core, or an EI-core.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for monitoring a leakage current in a heater connected to a heater power supply by a power cable, the power cable comprising a first power lead conducting an inlet current defining an inlet current direction and a second power lead conducting an outlet current defining an outlet current direction, the outlet current direction being opposite to the inlet current direction, the system comprising:
   a differential current electromagnetic sensor, comprising:
      a magnetic core defining a center region, wherein:
         the magnetic core includes an air gap; and
         the power cable is configured to pass through the center region one or more times; and
      a magnetic flux sensing device positioned in the air gap, the magnetic flux sensing device configured to provide a magnetic flux signal that is representative of a magnetic flux across the air gap;
   wherein:
      the magnetic flux across the air gap is indicative of a difference between the inlet current and the outlet current; and
      the difference between the inlet current and the outlet current defines the leakage current.

2. The system of claim 1, further comprising an interface circuit configured to:
   provide electrical power to the magnetic flux sensing device;
   receive the magnetic flux signal from the magnetic flux sensing device, the magnetic flux signal indicative of the magnetic flux across the air gap; and
   produce an output signal that is representative of the magnetic flux across the air gap.

3. The system of claim 1, wherein the heater power supply provides a direct current to the heater.

4. The system of claim 2, wherein:
   the magnetic flux sensing device is a Hall effect sensor;
   the interface circuit provides a bias voltage to the Hall effect sensor; and
   the output signal is a voltage representative of the magnetic flux across the air gap.

5. The system of claim 2, wherein:
   the heater power supply provides an alternating current to the heater;
   the magnetic flux across the air gap is an alternating magnetic flux; and
   the interface circuit is configured to receive an alternating magnetic flux signal from the magnetic flux sensing device.

6. The system of claim 2, wherein:
   the magnetic flux sensing device is a magnetoresistive sensor; and
   the output signal is a resistance value representative of the magnetic flux across the air gap.

7. The system of claim 1, wherein the power cable forms two or more turns around the magnetic core, thereby passing through the center region two or more times, respectively.

8. The system of claim 1, wherein the heater comprises:
   a resistive heating element;
   electrical insulation surrounding the resistive heating element; and
   a metallic sheath surrounding the electrical insulation;
   wherein:
      the first current flows into the resistive heating element to provide heat;
      the second current flows out of the resistive heating element;
      the leakage current flows from the resistive heating element to the metallic sheath; and
      the first current is equal to the sum of the second current and the leakage current.

9. The system of claim 1, wherein the magnetic core is a toroidal core, a square core, or an EI-core.

10. The system of claim 1, further comprising a polarity selection circuit configured to applying to the heater either a first polarity heater voltage or a second polarity heater voltage.

11. The system of claim 1, wherein the power cable passes through the center region once.

12. The system of claim 1, further comprising a clamp fixture, wherein:

the magnetic core further includes a split, thereby defining a first core piece and a second core piece; and the clamp fixture comprises:
- a first clamp piece, the first core piece and the magnetic flux sensing device disposed on the first clamp piece;
- a second clamp piece, the second core piece disposed on the second clamp piece; and
- a hinge assembly, configured to align the first clamp piece with the second clamp piece, wherein the magnetic core forms a magnetic circuit when the clamp fixture is in a closed position.

13. The system of claim 12, wherein the clamp fixture further comprises a locking mechanism, the locking mechanism configured to hold the clamp fixture in the closed position.

14. The system of claim 1, wherein:
the heater is disposed on an aircraft component; and
the aircraft component disposed on an external portion of an aircraft.

15. The system of claim 14, wherein:
the heater is disposed on an aircraft component;
the aircraft component disposed on an external portion of an aircraft; and
the heater is configured to control ice formation on the aircraft component.

16. A method of monitoring a leakage current in a heater connected to a power supply by a power cable, the power cable comprising a first power lead conducting an inlet current defining an inlet current direction and a second power lead conducting an outlet current defining an outlet current direction, the outlet current direction being opposite to the inlet current direction, the power cable traversing a center region of a magnetic core, the magnetic core including an air gap that is configured to accommodate a magnetic flux sensing device positioned therein, the magnetic flux sensing device configured to provide a magnetic flux signal that is representative of a magnetic flux across the air gap, the magnetic flux indicative of a difference between the inlet current and the outlet current, the method comprising:

supplying electrical power from a power source to a heater via the power cable,
wherein:
the inlet current flows through the first power lead; and
the outlet current flows through the second power lead;

providing electrical power to the magnetic flux sensing device;

receiving the magnetic flux signal from the magnetic flux sensing device, the magnetic flux signal indicative of the magnetic flux across the air gap; and producing an output signal that is representative of the magnetic flux across the air gap;

wherein the difference between the inlet current and the outlet current defines a leakage current.

17. The method of claim 16, wherein:
the power source provides direct current to the heater;
the magnetic flux sensing device is a Hall effect sensor;
providing electrical power to the magnetic flux sensing device comprises providing a bias voltage to the Hall effect sensor; and
the output signal is a voltage representative of the magnetic flux across the air gap.

18. The method of claim 16, wherein the power cable forms two or more turns around the magnetic core, thereby passing through the center region two or more times, respectively.

19. The method of claim 16, wherein:
the power cable passes through the center region once;
the magnetic core further includes a split, thereby defining a first core piece and a second core piece; and
the clamp fixture comprises:
- a first clamp piece, the first core piece and the magnetic flux sensing device disposed on the first clamp piece;
- a second clamp piece, the second core piece disposed on the second clamp piece; and
- a hinge assembly, configured to align the first clamp piece with the second clamp piece, wherein the magnetic core forms a magnetic circuit when the clamp fixture is in a closed position.

20. The method of claim 16, wherein the magnetic core is a toroidal core, a square core, or an EI-core.

* * * * *